(12) United States Patent
Ishibashi et al.

(10) Patent No.: US 9,824,960 B2
(45) Date of Patent: Nov. 21, 2017

(54) LEAD FRAME AND METHOD FOR MANUFACTURING SAME

(71) Applicant: Mitsui High-tec, Inc., Kitakyushu-shi, Fukuoka (JP)

(72) Inventors: Takahiro Ishibashi, Fukuoka (JP); Kimihiko Kubo, Fukuoka (JP); Ryota Furuno, Fukuoka (JP); Takaaki Katsuda, Fukuoka (JP)

(73) Assignee: Mitsui High-tec, Inc., Fukuoka (JP)

( * ) Notice: Subject to any disclaimer, the term of this patent is extended or adjusted under 35 U.S.C. 154(b) by 0 days.

(21) Appl. No.: 15/212,476

(22) Filed: Jul. 18, 2016

(65) Prior Publication Data
US 2017/0025329 A1    Jan. 26, 2017

(30) Foreign Application Priority Data
Jul. 24, 2015  (JP) .................................. 2015-146854

(51) Int. Cl.
*H01L 23/495* (2006.01)
*H01L 23/31* (2006.01)

(52) U.S. Cl.
CPC .... *H01L 23/49582* (2013.01); *H01L 23/3142* (2013.01); *H01L 23/49586* (2013.01); *H01L 23/3107* (2013.01); *H01L 23/49548* (2013.01); *H01L 2224/16245* (2013.01)

(58) Field of Classification Search
CPC ........... H01L 23/49513; H01L 21/4835; H01L 23/49582; H01L 21/4825
USPC ......................................................... 257/676
See application file for complete search history.

(56) References Cited

U.S. PATENT DOCUMENTS

| | | | |
|---|---|---|---|
| 2003/0153129 A1* | 8/2003 | Abbott ................ | H01L 21/4821 438/123 |
| 2012/0153447 A1* | 6/2012 | Jiang ..................... | H01L 21/563 257/673 |
| 2014/0224534 A1* | 8/2014 | Kubota ............... | H01L 23/3157 174/520 |

FOREIGN PATENT DOCUMENTS

JP          3-295262       12/1991

* cited by examiner

*Primary Examiner* — Marc Armand
*Assistant Examiner* — Sue Tang
(74) *Attorney, Agent, or Firm* — Rankin, Hill & Clark LLP

(57) ABSTRACT

Provided is a lead frame including: one or more solder bonding regions containing copper material or copper plating; and a molding resin adhesion region containing a copper oxide film. The solder bonding regions are exposed on a surface of the lead frame. Further, provided is a lead frame manufacturing method including: forming a resist film in a molding resin adhesion region that is included in a surface of a lead frame member made of copper, or that is included in a surface of a copper-plated lead frame member; forming a plating film by performing a metal plating process on one or more solder bonding regions included in the surface of the lead frame member; removing the resist film; and forming a copper oxide film by oxidizing the molding resin adhesion region.

4 Claims, 1 Drawing Sheet

LEAD FRAME AND METHOD FOR MANUFACTURING SAME

CROSS-REFERENCE TO RELATED APPLICATION

This application claims priority from Japanese Patent Application No. 2015-146854 filed with the Japan Patent Office on Jul. 24, 2015, the entire content of which is hereby incorporated by reference.

BACKGROUND

1. Technical Field

The present disclosure relates to a lead frame and a method for manufacturing the same.

2. Related Art

In quad flat non-leaded (QFN) package semiconductor devices including a flip-chip connection structure, typically solder is used for bonding a semiconductor chip to a lead frame. Accordingly, the lead frame surface includes copper material or copper plating.

As in other semiconductor devices, the QFN package is also required to have high adhesion between the lead frame and a molding resin (which may be hereafter simply referred to as the "resin") for increasing reliability.

As a means to achieve increased adhesion with the resin, a method referred to as black oxide treatment has been known. In this method, the lead frame is immersed in an oxidizing alkaline solution and the like so as to oxidize copper contained in the lead frame surface. In this way, a copper oxide film is formed on the lead frame surface. For example, JP-A-3-295262 describes an anode oxidizing method, where a resultant copper oxide film has high adhesion with a resin, ensuring high packaging reliability.

SUMMARY

A lead frame according to one embodiment of the present disclosure includes: one or more solder bonding regions containing copper material or copper plating; and a molding resin adhesion region containing a copper oxide film. The solder bonding regions are exposed on a surface of the lead frame.

DETAILED DESCRIPTION

Figure 1A:
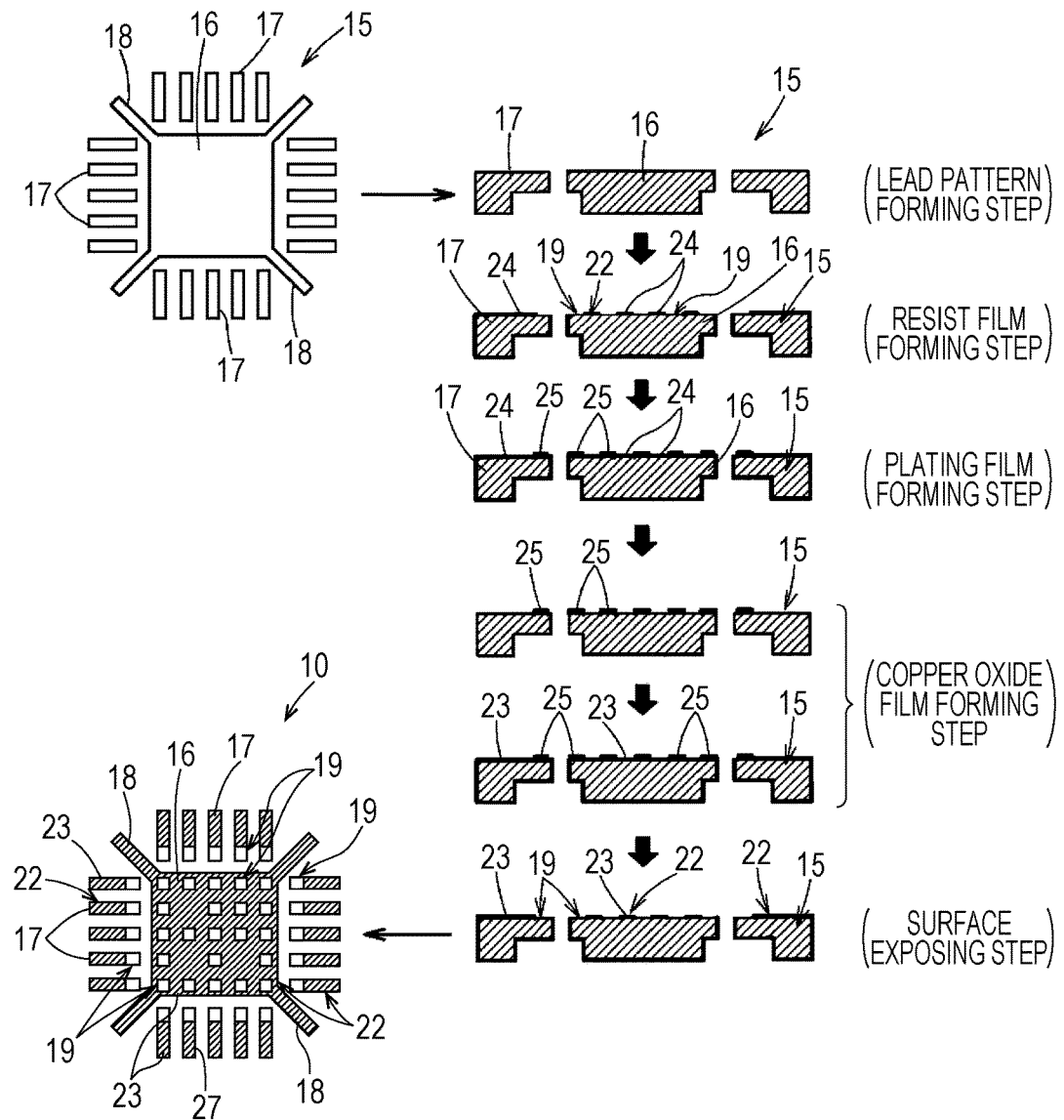
FIG. 1A is a flow diagram of a lead frame and a method for manufacturing the same according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

When the surface of a lead frame is covered with a copper oxide film, resin adhesion can be increased. However, the copper oxide film is associated with the phenomenon of insufficient solder wettability, decreasing the reliability of semiconductor chip bonding. When the lead frame surface contains copper material or copper plating, there will be no problem of wettability of the solder for bonding; however, packaging reliability cannot be ensured due to lack of resin adhesion. On the other hand, when the lead frame surface includes a copper oxide film, resin adhesion is increased; however, solder wettability cannot be ensured. Accordingly, there is a trade-off between increasing resin adhesion and ensuring solder wettability.

An object of the present disclosure is to provide a lead frame with which high solder wettability and high resin adhesion can be both achieved, and a method for manufacturing the same.

To achieve the above object, a lead frame according to a first embodiment includes: one or more solder bonding regions containing copper material or copper plating; and a molding resin adhesion region containing a copper oxide film. The solder bonding regions are exposed on a surface of the lead frame.

In the lead frame according to the first embodiment, the one or more solder bonding regions may include a semiconductor chip bonding region.

To achieve the above object, a lead frame manufacturing method according to a second embodiment may include: forming a resist film in a molding resin adhesion region that is included in a surface of a lead frame member made of copper, or that is included in a surface of a copper-plated lead frame member; forming a plating film by performing a metal plating process on one or more solder bonding regions included in the surface of the lead frame member; removing the resist film; and forming a copper oxide film by oxidizing the molding resin adhesion region.

To achieve the above object, the lead frame manufacturing method according to the second embodiment may include removing the plating film.

In the lead frame manufacturing method according to the second embodiment, the one or more solder bonding regions may include a semiconductor chip bonding region.

In the lead frame manufacturing method according to the second embodiment, the metal may be silver.

In the lead frame according to the first embodiment and the lead frame manufacturing method according to the second embodiment, the solder bonding region contains copper material or copper plating. The solder bonding region is a portion of the lead frame surface which is provided for bonding the lead frame with another member using solder. The solder bonding region of the lead frame according to the first embodiment is exposed on the lead frame surface. In the lead frame manufacturing method according to the second embodiment, the solder bonding region may be plated with a metal capable of bonding with solder, whereby high solder wettability can be obtained. In the lead frame according to the first embodiment and the lead frame manufacturing method according to the second embodiment, the molding resin adhesion region contains a copper oxide film, whereby high resin adhesion can be obtained. Accordingly, both high solder wettability and high resin adhesion can be achieved, thereby ensuring both semiconductor chip bonding reliability and packaging reliability. The molding resin adhesion region is a portion of the lead frame surface which is provided to ensure adhesion of the molding resin as an sealing agent onto the lead frame.

Particularly, in the lead frame manufacturing method according to the second embodiment, the plating film is formed by plating the solder bonding region on the surface of the lead frame member with a metal. Accordingly, when the surface exposed by removing the resist film is later subjected to an oxidizing process, for example, penetration of oxidizing fluid into any gap between the surface of the lead frame member and the plating film in the solder bonding region can be suppressed. Accordingly, when the plating film is removed, the surface of the lead frame member can be reliably exposed in the solder bonding region, whereby high solder wettability can be obtained. In addition, the use of the plating film makes it possible to easily deal with fine shapes. Furthermore, even if there are residues on the plating film or if the plating film is oxidized during the oxidizing process, the plating film can be removed after the oxidizing process, thus eliminating any quality problems.

When silver is used as the metal contained in the plating film, as long as existing equipment has a silver plating apparatus, for example, the existing equipment can be utilized as is without incurring additional investment in new equipment. As a result, an increase in equipment cost can be suppressed.

Figure 1B:
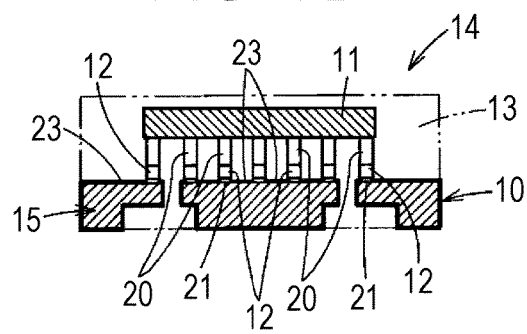
FIG. 1B is a lateral cross sectional view of a semiconductor device using the lead frame.

The present embodiment will be described in greater detail with reference to the attached drawings so as to facilitate an understanding of the present embodiment. Referring to FIGS. 1A and 1B, a lead frame 10 according to the present embodiment is used in a semiconductor device 14 (a QFN package having the so-called flip-chip connection structure). The semiconductor device 14 is obtained by sealing a semiconductor chip (semiconductor element) 11 bonded using the solder 12, with a molding resin 13. In the following, the lead frame 10 will be described in detail.

The lead frame 10 includes a lead frame member 15. The lead frame member 15 has a lead pattern including a pad 16, leads 17, and connecting portions 18. The lead frame member 15 is formed in substantially the same shape as the lead frame 10 by etching a thin plate of copper (Cu). The lead pattern is not limited to the pattern shown in FIG. 1A. Accordingly, the lead frame member 15, which is made of copper (copper material), may have a copper-plated, iron-nickel alloy (Fe—Ni alloy) surface.

The lead frame 10 includes bonding regions 19 for the solder 12 (solder bonding regions). The solder bonding regions 19 are disposed, for example, within the pad 16 (at a plurality of locations therein) and at the ends (the pad 16 side) of the leads 17. The solder bonding regions 19 may be variously modified in accordance with the type of the semiconductor device. For example, when the lead frame member 15 is made of copper, the solder bonding regions 19 may contain copper material. When the lead frame member includes a copper-plated alloy surface, the solder bonding regions 19 may have copper plating.

To the solder bonding regions 19, the semiconductor chip 11 is bonded using the solder 12, for example (in the present disclosure, the solder bonding regions 19 may be referred to as "semiconductor chip bonding regions"). The semiconductor chip 11 has a plurality of electrode pads (terminals) 20 on one side. At the ends of the electrode pads 20, the solder 12 is provided. The electrode pads 20 may not be provided with the solder 12 in advance; in which case, the solder 12 in the form of balls may be used. When the semiconductor chip 11 is bonded to the semiconductor chip bonding regions, the solder 12 provided with flux 21 is placed on the solder bonding regions 19 of the lead frame 10, and thereafter the solder 12 is heated.

When it is necessary to provide solder bonding regions other than the above-described semiconductor chip bonding regions, the other solder bonding regions may also contain the copper material of the lead frame member 15 (made of copper) or the copper plating provided on the alloy surface of the lead frame member. The other solder bonding regions aside from the semiconductor chip bonding regions may include, for example, a surface on the back side of the lead frame (the opposite side from the side facing the semiconductor chip). The surface on the back side of the lead frame may be used for solder-bonding the lead frame onto a substrate.

The lead frame 10 includes adhesion regions 22 for the molding resin 13. The adhesion regions 22 are disposed at parts of the surface of the lead frame 10 facing the semiconductor chip 11 and parts of the back side surface. The adhesion regions 22 may be variously modified in accordance with the type of the semiconductor device. The adhesion regions 22 may contain a copper oxide film 23 formed by oxidizing the copper material contained in the lead frame member, or the copper plating on the lead frame member surface.

In the present example, the regions containing the copper oxide film 23 include not only the adhesion regions 22 for the molding resin 13 but also the entire region of the lead frame member surfaces except for the solder bonding regions 19. However, the regions containing the copper oxide film 23 are not limited to the present example. Of the entire region of the lead frame member surfaces except for the solder bonding regions 19, at least the adhesion regions 22 for the molding resin 13 may contain the copper oxide film 23.

A method for manufacturing the lead frame according to the present embodiment will be described with reference to FIGS. 1A and 1B. This method is a method for manufacturing the lead frame 10 used in the semiconductor device 14. The semiconductor device 14 is obtained by sealing the semiconductor chip 11 bonded using the solder 12, with the molding resin 13. The manufacturing method includes a lead pattern forming step, a resist film forming step, a plating film forming step, a copper oxide film forming step, and a surface exposing step. The steps will be described in detail in the following.

(Lead Pattern Forming Step)

A thin plate of copper is etched to form the lead frame member 15 with the lead pattern including the pad 16, the leads 17, and the connecting portions 18. The lead frame member 15 is formed in substantially the same shape as the lead frame 10.

(Resist Film Forming Step)

On the surface of the lead frame member 15 having the predetermined lead pattern, a resist film 24 is formed in the adhesion regions 22 for the molding resin 13 (the regions including, in the present example, the entire surfaces of the lead frame member 15 except for the solder bonding regions 19).

The resist film 24 is formed by covering the entire surfaces (including the front and back surfaces) of the lead frame member 15 with a plating-resistant photoresist film, exposing the solder bonding regions 19 to light, and then performing a developing process.

(Plating Film Forming Step)

A plating film 25 is formed by subjecting, of the surface of the lead frame member 15 having the predetermined lead pattern, the solder bonding regions 19 to a metal plating process. From the viewpoint of effective utilization of existing equipment and in consideration of the ease of peeling from the lead frame member 15, a preferable example of the metal used for the plating process is silver (Ag). Other examples of the metal that may be used include nickel (Ni) and gold (Au). The plating process may involve flash plating. The plating film 25 may have a thickness of the order of 0.001 to 0.5 μm, for example.

(Copper Oxide Film Forming Step)

The resist film 24 formed in the resist film forming step is removed to expose the underlying surfaces, and the surfaces are subjected to an oxidizing process to form the copper oxide film 23. The method for the oxidizing process is not particularly limited. An example of the oxidizing process is a method involving immersion in an oxidizing alkaline solution (black oxide treatment). Because the plating film 25 is formed in the solder bonding regions 19 by the plating film forming step, oxidation of the solder bonding regions 19 can be suppressed. Accordingly, the copper oxide film 23 can be formed only in the regions other than the regions containing the plating film 25.

(Surface Exposing Step)

The plating film 25 formed in the plating film forming step is removed to expose the surface (solder bonding regions 19) of the lead frame member 15. An example of the method for removing the plating film 25 is electric peeling. When the lead frame member 15 is made of copper, the exposed surface contains copper material. When the lead frame member has a surface containing copper plated alloy, the exposed surface contains copper plating.

When the solder bonding regions 19 of the lead frame include regions other than the semiconductor chip bonding regions (for example, solder bonding regions on the back side of the lead frame), a metal plating process is also performed on the other regions in the plating film forming step. The plating film formed in the plating process is removed from the surface of the lead frame member (solder bonding regions 19) in the surface exposing step. Accordingly, after the surface exposing step, the solder bonding regions are exposed on the lead frame surface. However, depending on the type of metal contained in the plating film 25, or the thickness of the plating film 25, it may be possible to perform solder bonding while the plating film 25 is maintained (i.e., if the plating film does not affect solder bonding, such as when bonding by diffusion bonding). In this case, the surface exposing step may be omitted. When the solder bonding regions 19 include the regions other than the semiconductor chip bonding regions, the other regions may also be subjected to a plating process using a metal capable of bonding with solder, in the plating film forming step. The plating film formed in the other regions by the plating process may not be removed.

By manufacturing the semiconductor device 14 using the lead frame 10 obtained by the above-described method, high solder wettability and high resin adhesion can be both achieved. Accordingly, both bonding reliability and packaging reliability of the semiconductor chip 11 can be ensured.

The present embodiment is not limited to the configuration of the embodiment described above. The scope of the present embodiment may include various other embodiments or modifications that may occur to those skilled in the art in view of the matters described herein. For example, the scope of the present embodiment includes lead frames and methods for manufacturing the same based on combinations of a part or all of the embodiments or their modifications.

While the embodiment has been described with reference to the lead frame used in a QFN package of the flip-chip connection structure, the lead frame of the present embodiment is not limited to such configuration. The lead frame of the present embodiment may be applied to any lead frame for use in a semiconductor device obtained by sealing the bonded portion of a semiconductor chip bonded using solder, with a molding resin.

The lead frame according to embodiments of the present disclosure may include the following first or second lead frame.

The first lead frame is a lead frame for use in a semiconductor device having a semiconductor chip bonded using solder, the semiconductor device being sealed with a molding resin, the lead frame including a solder bonding region having a surface including copper material or copper plating and a molding resin adhesion region having a surface including a copper oxide film.

The second lead frame is the first lead frame including another region for solder bonding separate from the solder bonding region. The other region has a surface including copper material or copper plating.

The lead frame manufacturing method according to embodiments of the present disclosure may include the following first to fourth lead frame manufacturing methods.

The first lead frame manufacturing method is a method for manufacturing a lead frame for use in a semiconductor device including a semiconductor chip bonded using solder, the semiconductor device being sealed with a molding resin, the method including: a resist film forming step of forming a resist film on, of a surface of a lead frame member made of copper or provided with copper plating, a portion that is to provide an adhesion region for the molding resin; a plating film forming step of forming a plating film by performing a metal plating process on, of the surface of the lead frame member, a portion that is to provide a bonding region for the solder; a copper oxide film forming step of forming a copper oxide film by oxidizing a surface exposed after the resist film formed in the resist film forming step is removed; and a surface exposing step of exposing the surface of the lead frame member by removing the plating film formed in the plating film forming step.

The second lead frame manufacturing method is the first lead frame manufacturing method, including providing another region for solder bonding separate from the solder bonding region, the plating film forming step further including performing a metal plating process on a surface of the other region.

The third lead frame manufacturing method is the first or second lead frame manufacturing method configured such that the metal is silver.

The fourth lead frame manufacturing method is a method for manufacturing a lead frame for use in a semiconductor device having a semiconductor chip bonded using solder, the semiconductor device being sealed with a molding resin, the method including: a resist film forming step of forming a resist film on, of a surface of a lead frame member made of copper or provided with copper plating, a portion that is to provide an adhesion region for the molding resin; a plating film forming step of forming a plating film by performing a plating process on, of the surface of the lead frame member, a portion that is to provide a bonding region for the solder, using a metal capable of bonding with the solder; and a copper oxide film forming step of forming a copper oxide film by oxidizing a surface exposed after the resist film formed in the resist film forming step is removed.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A lead frame manufacturing method comprising:
    forming a resist film in a molding resin adhesion region that is included in a surface of a lead frame member made of copper, or that is included in a surface of a copper-plated lead frame member;
    forming a plating film by performing a metal plating process on one or more solder bonding regions included in the surface of the lead frame member;
    removing the resist film;
    forming a copper oxide film by oxidizing the molding resin adhesion region; and
    removing the plating film to expose the one or more solder bonding regions of the surface of the lead frame member.

2. The lead frame manufacturing method according to claim 1, wherein the one or more solder bonding regions include a semiconductor chip bonding region.

3. The lead frame manufacturing method according to claim 2, wherein the metal is silver.

4. The lead frame manufacturing method according to claim 1, wherein the metal is silver.

* * * * *